United States Patent [19]
Petrie

[11] 4,255,712
[45] Mar. 10, 1981

[54] DIGITAL WAVEFORM CONDITIONING CIRCUIT

[76] Inventor: Adelore F. Petrie, 7 W. Lillian, Arlington Heights, Ill. 60004

[21] Appl. No.: 970,859

[22] Filed: Dec. 18, 1978

[51] Int. Cl.$^3$ .............................................. H03K 5/00
[52] U.S. Cl. ................................... 328/162; 328/127; 328/165
[58] Field of Search ............... 328/127, 128, 165, 162, 328/163, 164

[56] References Cited

U.S. PATENT DOCUMENTS

| | | | |
|---|---|---|---|
| 3,121,199 | 2/1964 | Harrison | 328/128 |
| 3,398,373 | 8/1968 | Caswell | 328/127 X |
| 4,025,867 | 5/1977 | Seidel | 328/127 |
| 4,110,698 | 8/1978 | Petrie | 328/128 X |

*Primary Examiner*—John S. Heyman

[57] ABSTRACT

The disclosed circuit permits AC coupling of digital waveforms and rejects low frequency interference, yet restores proper waveform even to low frequency digital signals which have suffered waveform distortion by having passed through a transmission channel or storage device with limited low frequency response. Said circuit consists of a differentiator bridged across a non-inverting digital amplifier.

10 Claims, 3 Drawing Figures

DIGITAL WAVEFORM CONDITIONING CIRCUIT

BACKGROUND OF THE INVENTION

This invention relates generally to digital electronic systems, in particular to waveform restoration systems used therein. Digital systems require that signals be in either of two states: "high" (voltage exceeding a specified value) or "low" (voltage less than a specified value) except during very fast transitions between these states. Any voltage between these states produces indeterminate results in the system, and therefore must be eliminated.

When digital information is transmitted between digital systems or retrieved from magnetic recording media, low frequency interference frequently causes the signal to spend time in this indeterminate state, causing erroneous digital information to be generated in the system. One cause of this low frequency contamination is 60 hertz power line magnetic fields or ground currents.

One prior art circuit used to eliminate low frequency interference is a differentiating network, which passes only the high frequency components of the applied signal. This device is unsatisfactory for use in digital circuits, since the output signal always returns to a "low" within one time constant and hense can not respond properly to digital signals which remain "high" for long periods of time. (The time constant of an R-C differentiating network is equal to the value of the resistor in ohms times the value of the capacitor in farads, with the result in seconds.)

A second prior art circuit is a (negative) feedback differentiator, which bridges a differentiating network across a linear inverting amplifier. The negative feedback provided by the linear inverting amplifier results in a more perfect differentiated signal at the output terminal. This negative feedback also causes the output to return to a fixed voltage, usually in the center of the active region, an undesired condition as described in the first paragraph of this section. Although these systems bear some similarity to the present invention, they are not used for the same purpose, because of the aforementioned limitations.

Because of the need for optimum waveform in digital systems and the many causes of interference and waveform distortion in recording and communication equipment, complex encoding and decoding schemes are presently used for this purpose. These schemes severely limit the rate at which digital information can be transferred in these systems.

SUMMARY OF THE INVENTION

The present invention incorporates a very simple circuit that permits AC coupling of digital signals by a unique combination of a differentiating network and a non-inverting digital amplifier. The use of a digital non-inverting amplifier output as the reference for said differentiating network results in said reference not being held at a fixed voltage, but being switched to a "high" or a "low" in phase with said applied signal. Thus, said output signal can remain either "high" or "low " indefinitely, depending on the last input transition, and has no tendency to return to the undesired intermediate state. This circuit permits the passage of digital signals from the high frequency limits of the devices themselves down to zero frequency (a "high" or "low" will be held indefinitely), yet it can reject any DC component or interference with rise and fall times slower than the desired signals.

It is therefore an object of the present invention to provide a simple means of shifting the DC level of a digital signal without limiting the frequency response of the digital system.

It is another object of the present invention to reject low frequency interference without limiting the frequency response of the digital system.

It is a further object of the present invention to recover the proper digital states from an applied signal which has suffered waveform distortion by having passed through a transmission channel or storage device with limited low frequency response.

It is still another object of the present invention to permit direct high speed transmission of digital information over transmission channels of limited bandwith without complex coding schemes.

DETAILED DESCRIPTION

The following disclosure is offered for public dissemination in return for the grant of a patent. Although it is detailed to ensure adequacy and aid understanding, this is not intended to prejudice that purpose of a patent which is to cover each new inventive concept therein no matter how others may later disguise it by variations in form or additions or further improvements.

Figure 1:
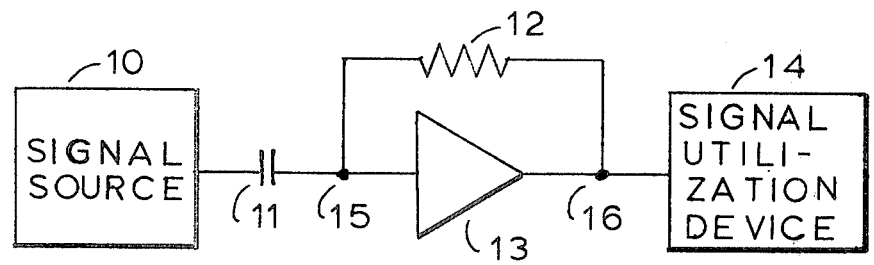
FIG. 1 is a block diagram of a digital waveform conditioning circuit constructed in accordance with the present invention.

FIG. 1 shows a digital waveform conditioning circuit in accordance with the present invention in which a source 10 of digitally encoded information in connected through capacitor 11 to the input terminal 15 of digital non-inverting amplifier 13. The output terminal 16 of amplifier 13 is connected to a digital information utilization device 14. Resistor 12 is connected between the input terminal 15 and output terminal 16 of amplifier 13. Digital information source 10 may include any digital system component, such as a computer telephone terminal, computer output device, or tape interface. Similarly, digital information utilization device 14 may comprise virtually any digital system or subsystem which would normally be coupled to digital information source 10. In other words, the present invention is likely to find application between any two digital system components.

A digital amplifier, as defined in this application, is a device whose input and output are specified in two stable states, a "high" or "low". When the input changes from a "high" to a "low", there is no change in the output until the input reaches the switching threshold or active region, at which time the output rapidly switches to the alternate stable state. This characteristic is required for proper operation of digital circuits as is well known to those skilled in the art.

Digital non-inverting amplifier 13 produces an output state the same as its input state. For example, if a positive going pulse is applied to input terminal 15, a positive-going pulse would appear as its output terminal 16 and be coupled to digital utilization system 14. A number of well-known gate and amplifier combinations may be utilized to perform this non-inverting function. For example, an AND gate which produces an output signal of the same polarity when its input terminals coincide will provide the non-inverting output signal of amplifier 13 if both its input terminals are commonly coupled to terminal 15 and its output terminal coupled to digital unitization device 14. In the same manner an OR gate, which produces a positive output when either of its input terminals receives a positive signal, having input terminals commonly coupled to terminal 15 and output terminal coupled to terminal 16, may perform the function of non-inverting cmplifier 13. Yet another embodiment for non-inverting amplifier 13 may be provided by an even number of inverters connected in cascade between terminal 15 and terminal 16. The even number of inversions is, of course, to assure a like polarity signal at input terminal 15 and output terminal 16. These examples are merely illustrative and not exlusionary. It will be apparent is those skilled in the digital art that any number of gate and amplifier combinations may be used to satisfy the requirements of non-inverting amplifier 13 provided they produce an output signal of the same polarity as the input signal and are in that sense "non-inverting" stages. Note that an inverting digital amplifier is shown with a circle at its output, while a non-inverting amplifier (sometimes made by connecting two inverting amplifiers in cascade) is shown without said circle per standard practice in the digital art.

Figure 2:
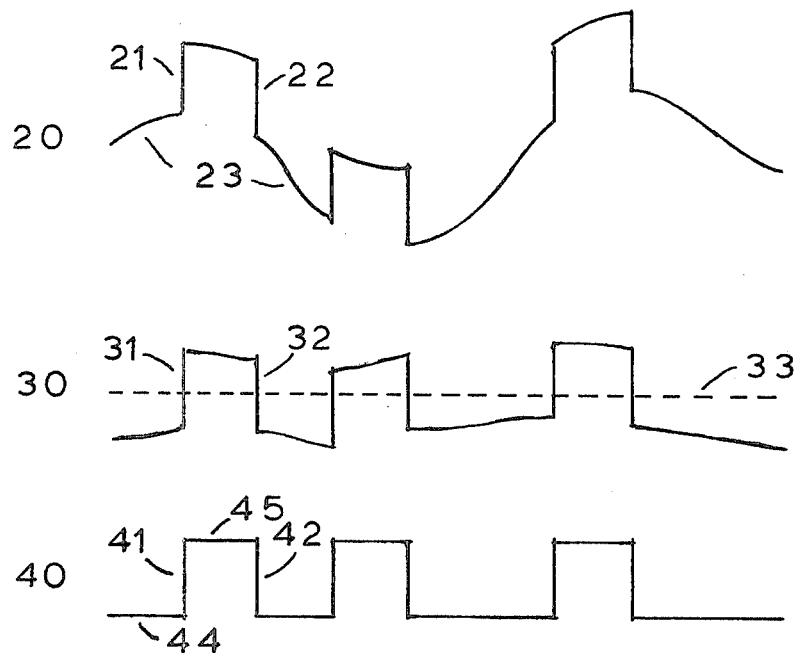
FIG. 2 shows a group of signal waveforms associated with the operation of the present invention.

The operation of the present invention waveform conditioning circuit is best understood by reference to waveforms 20, 30 and 40 shown in FIG. 2. More particularly, waveform 20 shows a digital output signal of digital information source 10 having a positive going leading edge 21 and a negative going trailing edge 22. Also present on waveform 20 is a large sine wave component 23 exemplary of the type which often contaminates a binary encoded signal. This signal applied through capacitor 11 produces waveform 30 at terminal 15. Notice that the differentiating action of capacitor 11 and resistor 12 attenuate the sine wave portion 23 of the input waveform so that it has insufficient amplitude to cross the switching threshold of amplifier 13 as represented by dashed line 33. However, positive leading edge 21 is passed unattenuated through capacitor 11 and crosses switching threshold 33 at 31. This causes amplifier 13 to change state as shown at 41 on waveform 40 which appeares at output terminal 16. This causes the input terminal 15, which was formerly pulled toward a "low" 44 through resistor 12, to now be pulled toward a "high" 45. It will remain high until a negative trailing edge 22 once more crosses the switching threshold at 32, reversing the process, and causing the output to switch back to a low at 42.

Figure 3:
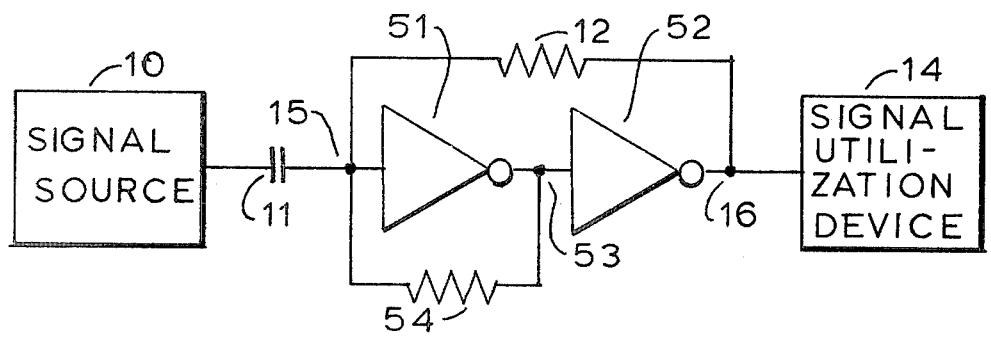
FIG. 3 shows the circuit of FIG. 1 adapted for use with smaller applied signals.

FIG. 3 shows a modification of the present invention waveform conditioning circuit which responds to smaller applied digital pulses. In this figure, all the like parts are similarly numbered to FIG. 1 and perform a similar function, with the exception of inverting amplifier 51 and resistor 54. Inverting amplifiers 51 and 52 connected in cascade perform the same non-inverting function as amplifier 13 as explained above. Resistor 54 connected between inverting terminal 53 and input terminal 15 reduces the offset produced by resistor 12 so that a smaller voltage is required to cross threshold 33 of waveform 30 in FIG. 2, and hense the circuit will respond to smaller applied signals.

As an example of a specific embodiment, the non-inverting amplifier 13 is two stages of a 14069 C-MOS, as described on page 5-136 in Motorola's Semiconductor Data Library, Volume 5, Series B. Resistors 12 and 54 are typically 10,000 ohms and capacitor 11 is 0.01 microfarads. The R-C time constant should be greater than the worst rise or fall time expected in the applied digital signal for proper operation. The smallest value required should be used to obtain best rejection of low frequency interference.

Other minor modifications may be required to adapt the principles set forth in this disclosure to other logic systems using means well known to those skilled in the art.

From the above disclosure it is clear that the present invention differs from previous devices in connecting a differentiating network across a non-inverting digital amplifier (rather than the prior art inverting linear amplifier) so as to produce the new and useful result of rejecting low frequency interference, yet passing digital signals and even restoring proper waveshape to low frequency digital signals which have suffered degradation due to having passed through a system with limited low frequency response. To pass a signal through a differentiating network and obtain improved low frequency performance is certainly a new and unusual result.

I claim:

1. A digital waveform conditioning circuit for use in digital information systems for shifting levels or eliminating low frequency interference from applied signals comprising:

non-inverting digital amplifier means, responsive to said applied signals, having an input terminal and an output terminal, and feedback means, coupled to said non-inverting digital amplifier means, combining the functions of differentiating said applied signals and adding a portion of the output signal in phase aiding to said differentiated applied signals, said feedback means including a means to provide positive feedback bias to said input terminal of said non-inverting digital amplifier means, causing its output to remain in a high or low state as determined by said applied signals, after removal of said applied signals, and not return to the undesired indeterminate state, or a fixed quiescent state.

2. The digital waveform conditioning circuit set forth in claim 1, wherein said feedback means includes a first means, including a capacitor, connecting said input terminal of said non-inverting digital amplifier means to said applied signals.

3. The digital waveform conditioning circuit set forth in claim 2, wherein said feedback means further includes a second means, including a resistor, connected between said input terminal and output terminal of said non-inverting digital amplifier means.

4. The digital waveform conditioning circuit set forth in claim 3, further including an inverting digital amplifier means, whose input terminal is common to the input terminal of said non-inverting digital amplifier means, and whose output terminal is connected through a means including a resistor to said common input terminal, said inverting amplifier and resistor reducing said positive feedback bias at said input terminal, causing said digital waveform conditioning circuit to respond to smaller applied digital signals.

5. The digital waveform conditioning circuit set forth in claim 4, wherein said inverting digital amplifier means forms a portion of said non-inverting digital amplifier means.

6. A digital waveform conditioning circuit for use in digital information systems, for restoring proper waveshape to applied signals which may contain low frequency distortion, comprising:
   differentiating circuit means responsive to said applied signals, having an output terminal and a reference terminal, and
   non-inverting digital amplifier means whose input terminal is coupled to the output terminal of said differentiating circuit means and whose output is coupled to the reference terminal of said differentiating circuit means, thereby causing said reference terminal to switch to a low or high state in response to rapid transitions in said applied signals, and to remain in said low or high state and not return to the undesired indeterminate state or a fixed quiescent state, during slow changes in said applied signals or after removal of said applied signals.

7. The digital waveform conditioning circuit set forth in claim 6, wherein said differentiating circuit means includes a first means, including a capacitor, connecting said input terminal of said non-inverting digital amplifier means to said applied signals.

8. The digital waveform conditioning circuit set forth in claim 7, wherein said differentiating circuit means further includes a second means, including a resistor, connected between said input terminal and output terminal of said non-inverting digital amplifier means.

9. The digital waveform conditioning circuit set forth in claim 7, further including an inverting digital amplifier means, whose input terminal is common to the input terminal of said non-inverting digital amplifier means, and whose input terminal is connected through a means including a resistor to said common input terminal; said inverting amplifier and resistor reducing the voltage offset produced by said second means at said input terminal, causing said digital waveform conditioning circuit to respond to smaller applied digital signals.

10. The digital waveform conditioning circuit set forth in claim 9, wherein said inverting digital amplifier means forms a portion of said non-inverting digital amplifier means.

* * * * *